(12) United States Patent
Sizov

(10) Patent No.: US 8,412,499 B2
(45) Date of Patent: Apr. 2, 2013

(54) PORTABLE IN-THE-VEHICLE ROAD SIMULATOR

(76) Inventor: Konstantin Sizov, Newton, MA (US)

( * ) Notice: Subject to any disclaimer, the term of this patent is extended or adjusted under 35 U.S.C. 154(b) by 0 days.

(21) Appl. No.: 12/979,280

(22) Filed: Dec. 27, 2010

(65) Prior Publication Data

US 2011/0131026 A1 Jun. 2, 2011

Related U.S. Application Data

(63) Continuation of application No. 10/742,613, filed on Dec. 19, 2003, now abandoned, which is a continuation of application No. PCT/US03/10529, filed on Apr. 7, 2003.

(60) Provisional application No. 60/370,277, filed on Apr. 5, 2002.

(51) Int. Cl.
*G06G 7/48* (2006.01)
*G09B 9/04* (2006.01)

(52) U.S. Cl. .............................................. 703/8; 434/67

(58) Field of Classification Search ........................ 703/8
See application file for complete search history.

(56) References Cited

U.S. PATENT DOCUMENTS

| | | | |
|---|---|---|---|
| 4,186,593 A | 2/1980 | Watanabe | |
| 4,442,708 A | 4/1984 | Gable et al. | |
| 4,912,970 A * | 4/1990 | Gicewicz | 73/146 |
| 4,998,594 A | 3/1991 | Orloski | |
| 5,477,453 A | 12/1995 | Harashima | |
| 5,621,168 A | 4/1997 | Kim et al. | |
| 5,707,237 A | 1/1998 | Takemoto et al. | |
| 5,919,045 A * | 7/1999 | Tagge et al. | 434/62 |
| 5,921,780 A * | 7/1999 | Myers | 434/69 |
| 6,044,696 A | 4/2000 | Spencer-Smith | |
| 6,151,060 A | 11/2000 | Tabata | |
| 6,200,139 B1 | 3/2001 | Clapper | |
| 6,354,838 B1 * | 3/2002 | Tagge et al. | 434/62 |
| 6,356,812 B1 | 3/2002 | Cragun | |
| 6,505,503 B1 | 1/2003 | Teresi et al. | |
| 7,424,414 B2 * | 9/2008 | Craft | 703/8 |
| 2002/0018982 A1 * | 2/2002 | Conroy | 434/62 |

FOREIGN PATENT DOCUMENTS

| | | |
|---|---|---|
| DE | 200 00 556 U1 | 5/2000 |
| DE | 19928490 * | 12/2000 |
| DE | 100 33 442 A1 | 1/2002 |
| WO | 01/55690 A1 | 8/2001 |

OTHER PUBLICATIONS

PCT search report; pp. 1-3; 2008.*
EPO Translation of Foerst patent; pp. 1-2, obtained Apr. 22, 2012.*
EPO Translation of Foerst claims. p. 1; obtained Apr. 22, 2012.*
Office action for U.S. Appl. No. 12/211,143 (20090011389); pp. 1-6; Jun. 24, 2010.*
Foxlin et al.; WearTrack: A Self-Referenced Head and Hand Tracker for Wearable Computers and Portable VR; Proceedings of International Symposium on Wearable Computers (ISWC 2000), Oct. 16-18, 2000, Atlanta, GA; pp. 1-8.*

* cited by examiner

*Primary Examiner* — Hugh Jones
(74) *Attorney, Agent, or Firm* — Patentbar International, P.C.

(57) ABSTRACT

The portable simulation system is a computer-based driving simulator, which uses an actual vehicle as an input device, and a portable display to present a Virtual Driving Environment (VDE) to the driver. Vehicle's steered wheels are placed atop of the turntables permitting free operation of the steering wheel. The vehicle remains immobile while its engine and power steering can be turned off during the simulation. External non-invasive sensors can be placed under the gas and brake pedals, permitting any vehicle to be used in the simulator, including the driver's own vehicle. A digital interface to the vehicle's systems, like OBD II, can be used to increase the fidelity of the simulation. A portable computer used for driving simulation and VDE presentation provides a low cost simulation option. A simple configuration of the portable simulator does not require an external power source and can be set-up and operated at any parking space. Possible applications of the simulation system include driver training and testing.

1 Claim, 6 Drawing Sheets

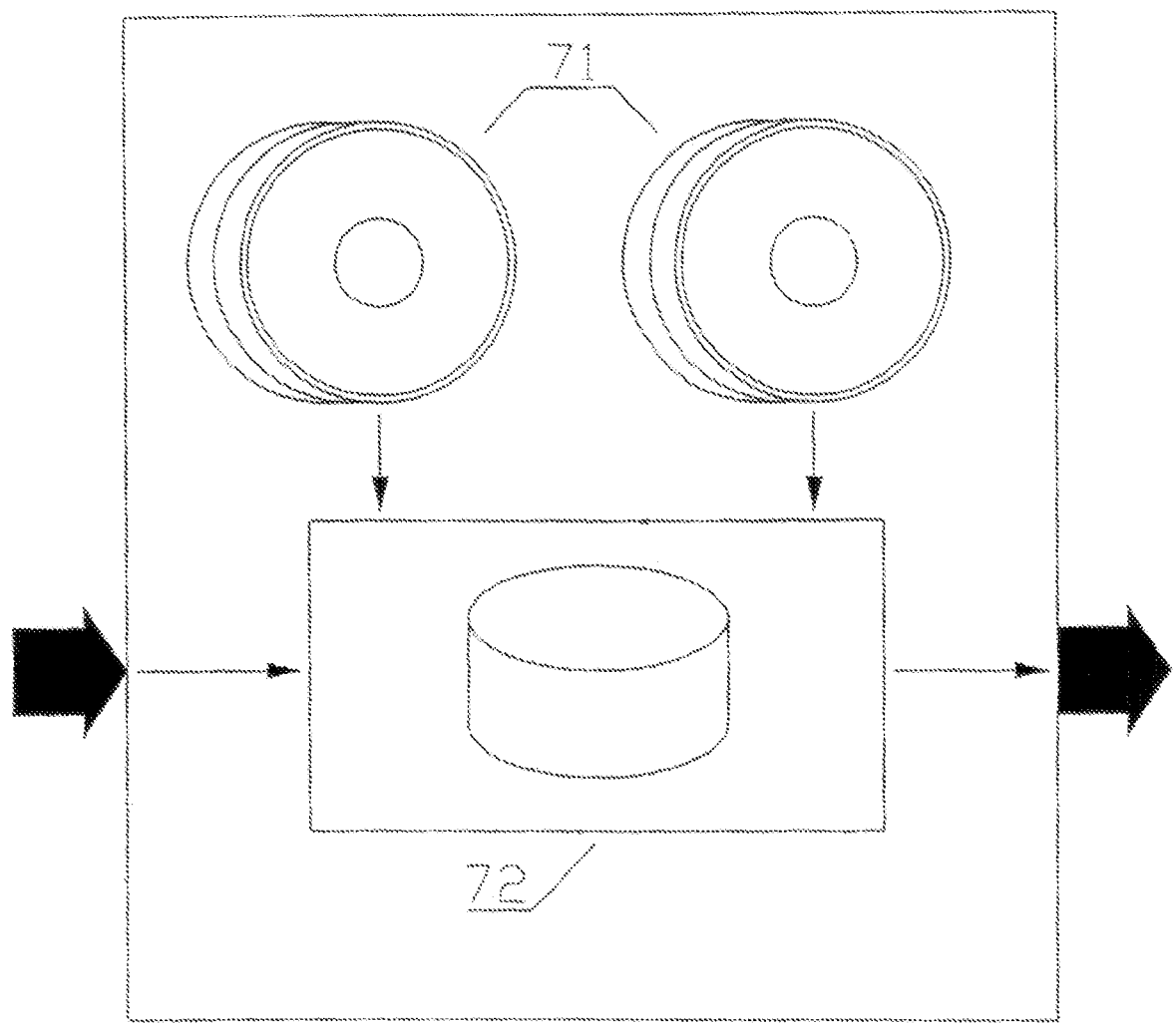

PORTABLE IN-THE-VEHICLE ROAD SIMULATOR

RELATED APPLICATIONS

This application is a Continuing application of U.S. application Ser. No. 10/742,613, filed on Dec. 19, 2003 now abandoned, which is a continuation of PCT application serial number PCT/US03/10529 filed on Apr. 7, 2003 which claims priority under the Paris Convention and 35 U.S.C. §119(e) from a U.S. provisional patent application Ser. No. 60/370,277, filed on Apr. 5, 2002, which provisional application is incorporated herein by reference.

BACKGROUND OF THE INVENTION

As public roads are becoming more and more congested, there is an increasing need to better train drivers of motor vehicles to decrease the number of road accidents. For example, one of the major causes of accidents, especially among younger drivers, is their inability to recognize a dangerous road situation due to the obstructed line-of-sight and path-of-travel. It is often very time consuming to train students to recognize dangerous road situations during the actual behind-the-wheel driving session. Such situations do not present themselves in a repeatable, consistent manner to each student driver. There are significant time gaps between their occurrences, which have a very large margin of error, causing a student to make unnoticed mistakes frequently. Unnoticed driving mistakes, in turn, cause the students to develop bad driving skills.

It is also very difficult to train drivers in hazardous road conditions without compromising the safety of the driver. Examples of such hazardous road conditions may include slippery roads, over-speeding on sharp turns, etc.

Training through driving simulation generally addresses the above issues.

A variety of solutions to the above-identified problem have dealt with simulation driving experiences. Those solutions broadly fall into two categories: (1) modifications of stock vehicles to simulate hazardous road conditions, and (2) complete computer-based simulated driving environments not involving a real vehicle.

Modifications of stock vehicles usually call for a dedicated vehicle to be used only for training, which cannot be otherwise used for driving. Simulation of the hazardous road conditions in such dedicated vehicles usually provides realistic haptic and motion feedback, while the spectrum of simulated experiences is limited mostly to tire skids.

Computer-based simulated driving environments, while providing the most training benefits, require a dedicated maintained floor space. They also frequently require a real car cabin to be used to achieve a high enough degree of realism of the simulation. When the kind of a training vehicle needs to be changed, the changing procedure usually calls for a cabin replacement, which is very costly and time consuming.

Both of the above-described categories also do not allow a driver to get the advantageous training inside the driver's own vehicle.

The present invention addresses the need to provide portability and realistic feel of driving an actual vehicle while not exposing the driver to the real hazardous road situation during training. The system of the present invention, can be quickly set-up and used in any available parking space.

BRIEF DESCRIPTION OF THE DRAWING FIGURES

FIG. 7 is a schematic illustration of a simulation engine software and courseware running on a computer.

DESCRIPTION OF THE INVENTION

Figure 1:
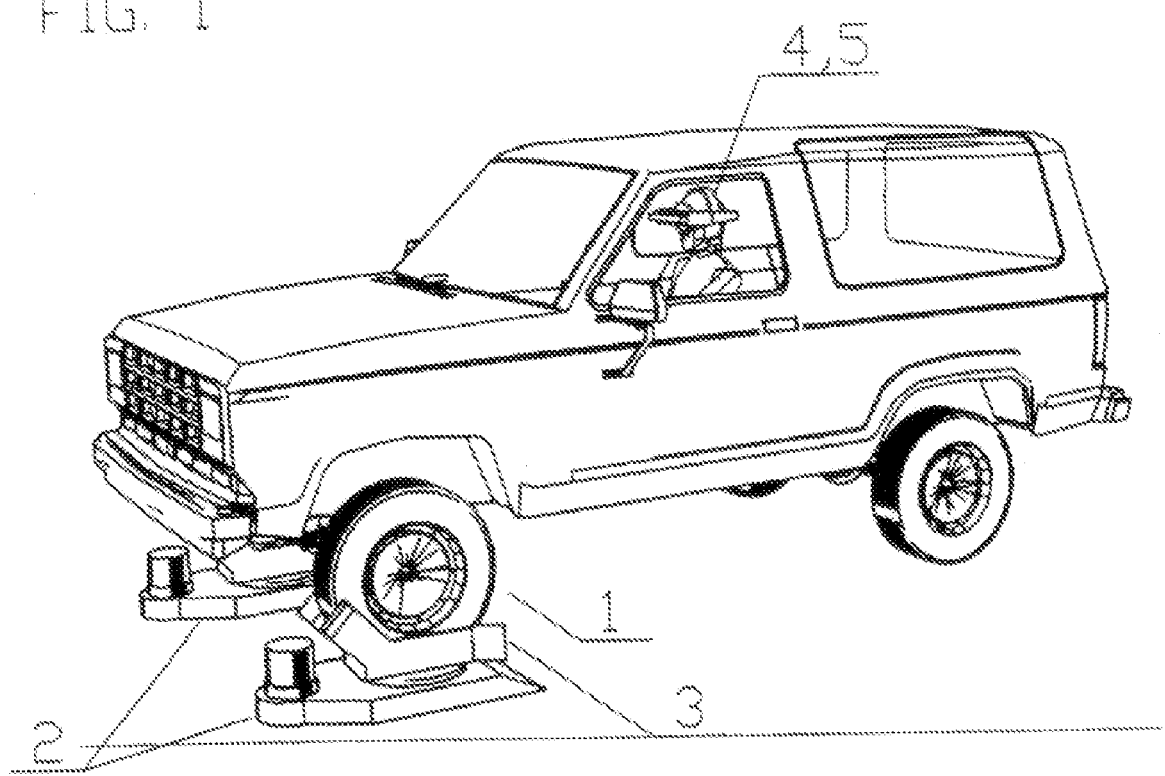
FIG. 1 is a general view of a portable system with an actual vehicle.

Turning now to FIG. 1, shown there is a portable system for driving simulation coupled with an actual vehicle. In operation, a driver/trainee uses an actual vehicle to drive up on a two-piece ramp 2. It should be appreciated that the driver can use any actual vehicle, including his or her own vehicle to receive the desired training. The choice of a vehicle provide the driver with an advantage to receive training in and get used to the vehicle that the driver will be actually driving after completing the training program. It should also be noted that the terms "driver", "student", "user" and "trainee" are used throughout this description interchangeably.

After the vehicle is positioned on the two-piece ramp 2, the engine of the vehicle is turned off. Steered wheels 1, controlled by the vehicle's steering wheel, located inside the cabin, are placed and optionally locked on top of turntables 3. Each turntable 3 can rotate around its own vertical axis, following the steering movements of the steered wheels 1.

While the vehicle is immobile and its power steering is not active, turntables 3 allow the driver/trainee to operate the steering wheel of the vehicle without applying excessive force, which would have been necessary on the actual road due to the friction between the steered wheels and the surface of the road while the vehicle is immobile. The steering wheel must be unlocked during the operation of the portable system of the present invention while the engine of the vehicle is turned off. In most vehicles turning off is accomplished by turning the key in the ignition of the vehicle without starting the engine. If a real-time force-feedback effect to the steering wheel is desired to be provided to the driver, the effect can be provided by optional steering actuators 61 located inside the turntables 3. Since the engine of the vehicle is not running during the simulation, the power steering is not active. To compensate for this lack of the actual power steering, smaller-than-natural forces can be applied to the steered wheels 1 of the vehicle by the steering actuators 61 in order to generate the realistic feedback.

Regardless whether the steering actuators 61 are present in the portable simulation system, the steering wheel returns to its central position driven by the natural forces resulting from exerting the weight of the vehicle to the Steering Angle Inclination (SAI) of the steered wheels 1. If the steering actuators 61 are used, the force returning the steering wheel to its central position depends on the simulated speed of the vehicle and is defined by the simulation software.

An optional steering sensor 39 (shown in FIG. 3) is used to generate information about a position of the steering wheel in order to generate corresponding simulated view of the road. The optional steering sensor 39 should be used when the vehicle's own built-in steering sensor is not available.

Figure 3:
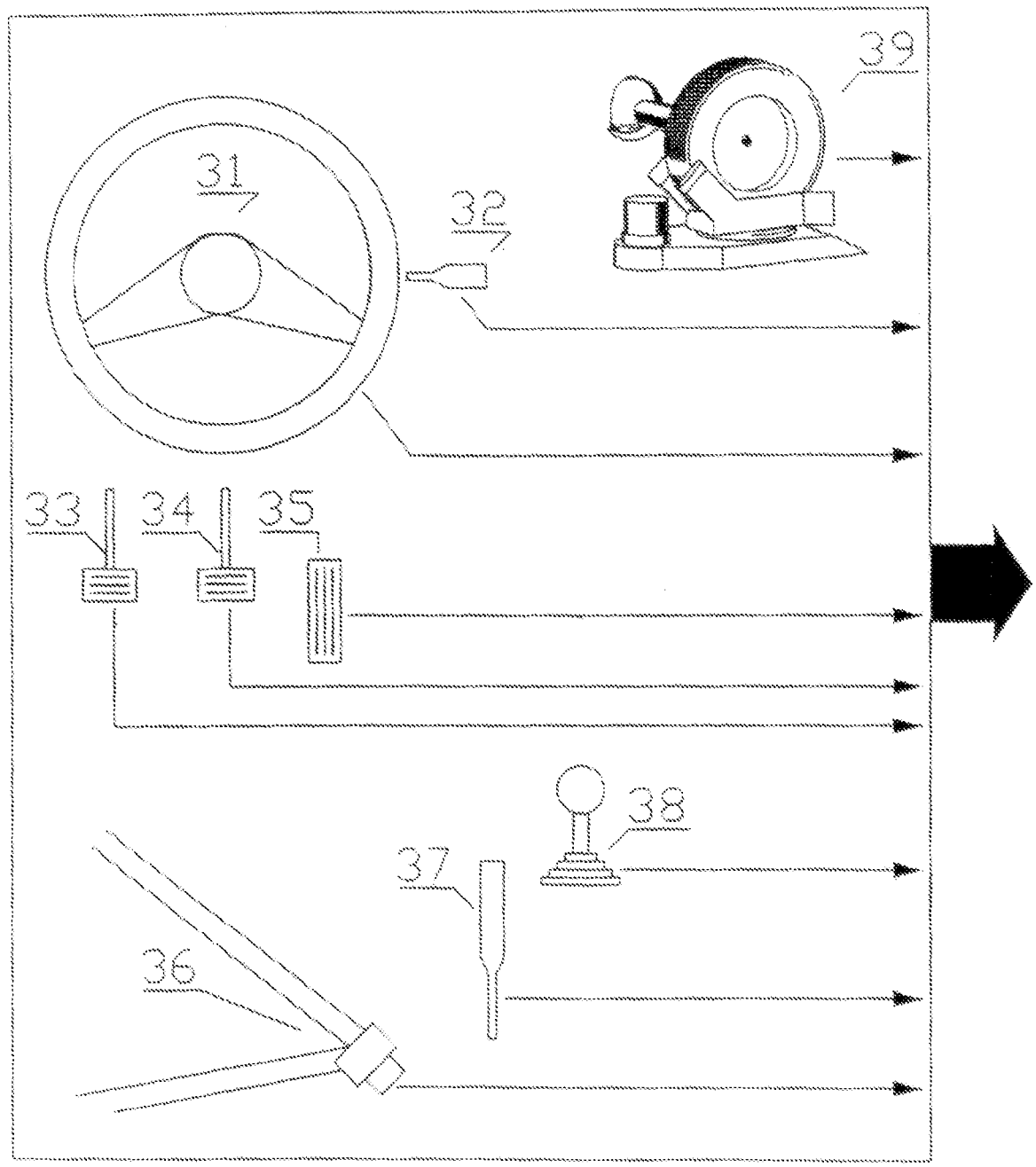
FIG. 3 is schematic illustration of sensors and interfaces for reading a real-time state of the vehicle's controls.
Figure 4:
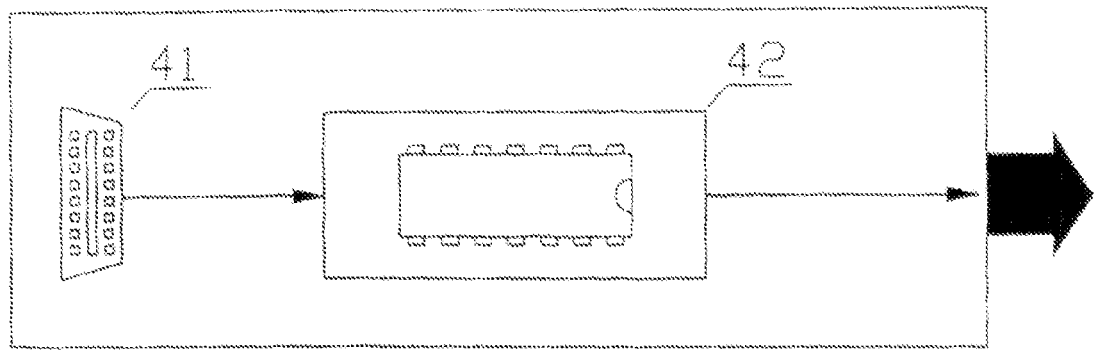
FIG. 4 is a schematic illustration of a digital interface between a vehicle's controls and on-board sensors.
Figure 6:
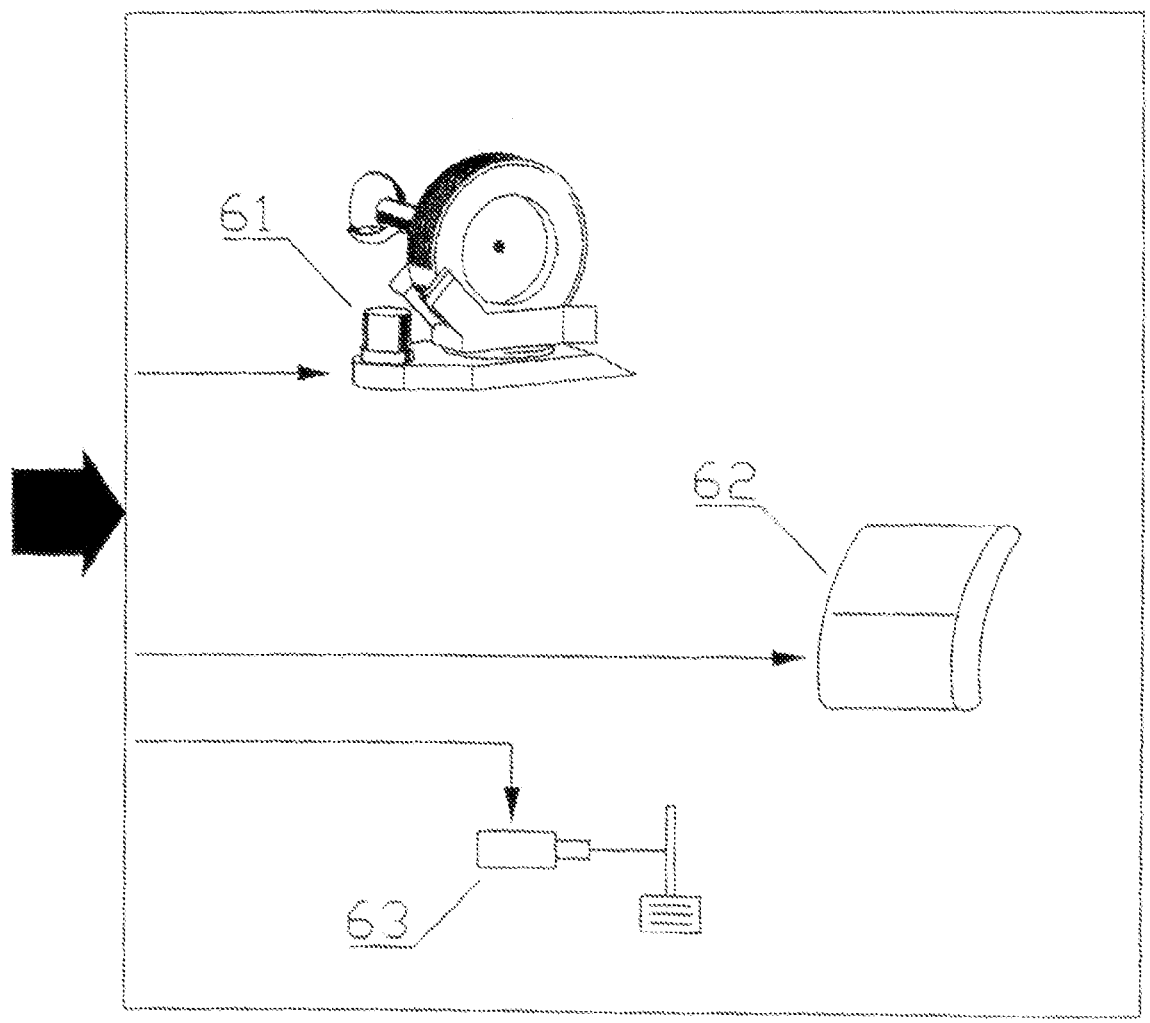
FIG. 6 is a schematic illustration of actuators.

Inside the vehicle an optional brake pedal sensor and actuator can be positioned under a brake pedal 34 (also shown in FIG. 3). An optional gas pedal sensor can be positioned under a gas pedal 35 (also shown in FIG. 3). The optional brake pedal sensor and the optional gas pedal sensor should be used when the vehicle's own built-in brake pedal and gas pedal sensors are not available. For practical reasons both brake pedal and gas pedal sensors can be mounted in a single enclosure. As shown in FIG. 6, an optional actuator 63 coupled to the brake pedal 34 can be used to simulate an anti-lock brake (ABS) pulsation.

Figure 2:
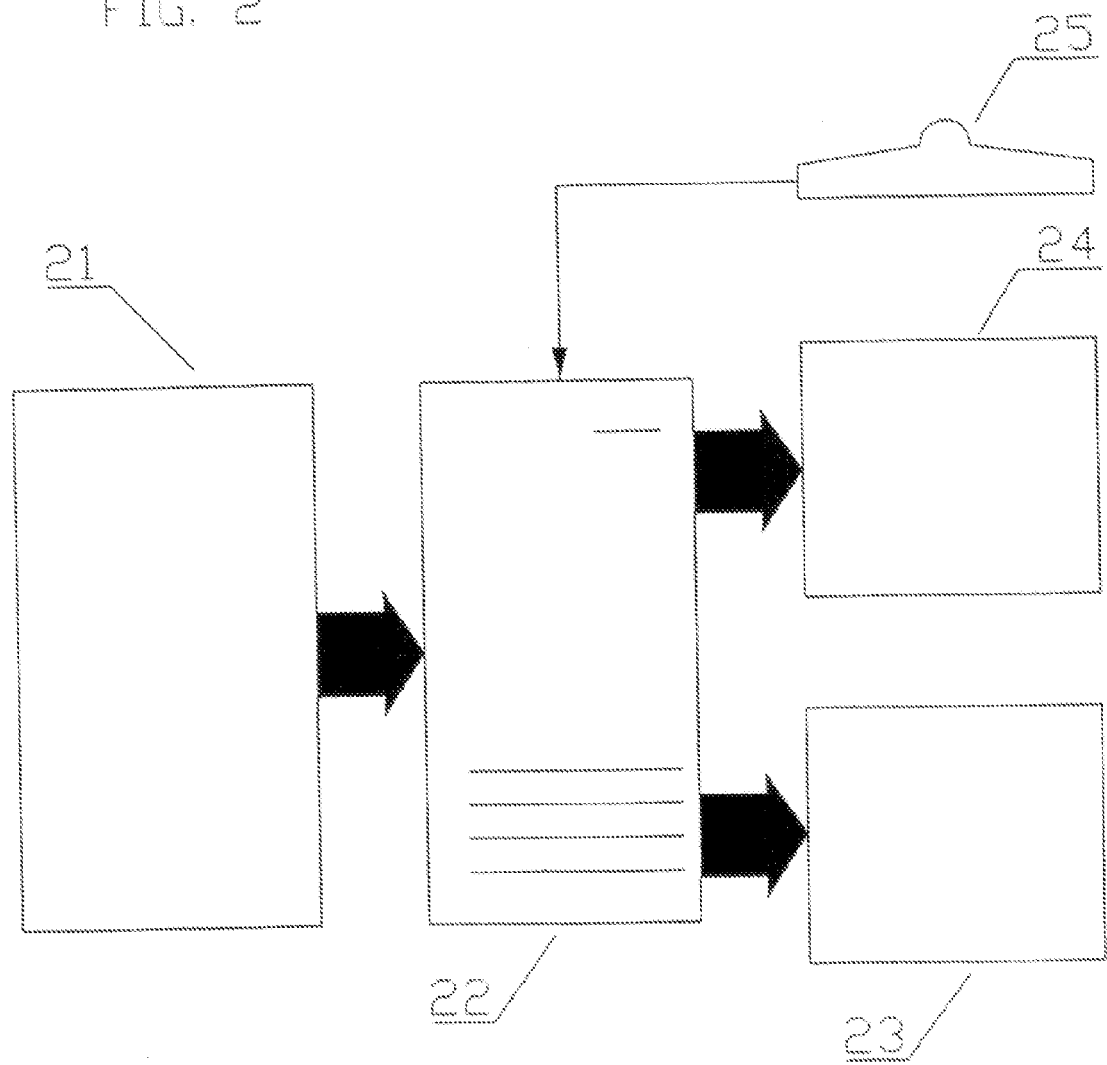
FIG. 2 is high-level block diagram of a simulator.

FIG. 2 shows a high-level block diagram of the portable simulator. As shown in FIG. 2, computing means 22 receive input data from non-invasive means for reading real-time state of the vehicle controls 21. A portable computer, such as a notebook computer having built-in 3D graphics processor can be used as computing means. The computer processes the input data and generates a Virtual Driving Environment (VDE) to be provided to the driver using audio and visual means 24. Audio and visual means normally consist of a Head-Mounted Display (HMD) and a set of headphones. Alternatively, other forms of portable displays can be employed, such as LCD screens pasted on the inside of the vehicle's windows, as well as a set of external speakers might be used. The VDE is presented to the driver in the field of view corresponding to the head orientation of the driver provided by the head tracker 25. To improve the fidelity of the simulation, the computer 22 controls an optional plurality of actuators 23, shown in further detail in FIG. 6, comprising a steering actuator 61, a motion feedback cushion 62 and an ABS pulsation actuator 63.

Shown in FIG. 7 is a schematic representation of the software for simulating a VDE running on the computing means 22. In the preferred embodiment the software is running on a portable computer powered by the battery of the vehicle or by the computer's own battery, therefore eliminating the need in an external power source. The portable computer is controlled by a Simulation Engine Software 72 processing the real-time state data from various vehicle controls, described further below. The Simulation Engine Software 72 processes the data from the head tracking sensor 25 (shown in FIG. 2) to generate an appropriate graphical representation of the VDE on the screen(s) of a Head Mounting Display 4 (HMD) as shown in FIG. 1. The Simulation Engine Software 72 is normally designed and maintained by software engineers. It provides an intermediate language for driver educators and researchers to describe a variety of road situations, or "scenarios", having an educational value.

Courseware Components 71, shown in FIG. 7, comprise driving lessons and "scenarios" created by the driving educators and researchers, who generally do not have a background in software engineering. Different Courseware Components can be designed by different organizations. They can be put together in sequences to design the desired curriculum.

Figure 5:
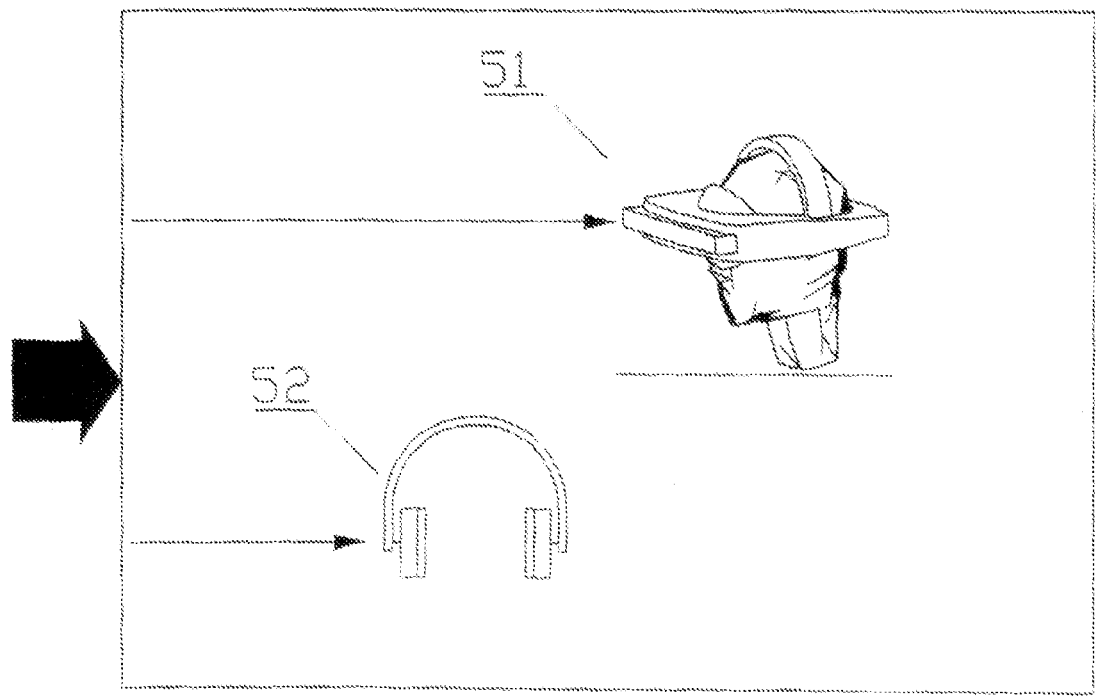
FIG. 5 is schematic illustration of audio-visual output devices.

The portable computer also comprises a sound processor that generates audio signals to enhance the representation of the VDE and communicate verbal instructions to the driver via headphones 52, shown in FIG. 5, frequently built into the HMD.

In order to reduce what is known to be "simulation sickness" sometimes resulting from the mismatch of the visual cues and the physical body cues, the driver can use an optional motion feedback cushion 62 shown in FIG. 6. Motion feedback cushions of the type commonly used in computer games usually comprise a set of low-frequency power speakers pushed against a person's back to apply vibrations to the person's body. An undesirable effect of the "simulation sickness" can be reduced by applying variations of the vibration patterns reflecting the changes in the driving conditions in the VDE. An optional brake pedal ABS-pulsation actuator 63 can be used to provide the simulated effect of operating an Anti-Lock Brake System.

Simulating operation of a vehicle using an actual vehicle can be accomplished by placing a pair of turntables 3 under the steered wheels 1 of the vehicle, as shown in FIG. 1, to relieve the friction of the steered wheels of the actual vehicle with a road surface. Placing the turntables under the steered wheels makes it possible for the steered wheels to be steered freely while the vehicle is immobile, enabling the actual vehicle's steering to be operated by a user without using excessive force. The method further comprises providing computing means 22 reading the real-time data of the state of the vehicle's controls to simulate a Virtual Driving Environment (VDE). The computing means is preferably a portable computer with a Simulation Engine Software. The software receives an input of the real-time data from the head tracking sensor 25, mounted on the HMD. The head tracking sensor communicates the exact orientation of the driver's head to the computer, so that the appropriate field of view of the VDE can be generated by the computer and displayed to the driver. In other words, using all of the above-described data, the computer generates a graphical representation of the VDE at the current orientation of the driver's head and displays the graphical representation by the portable audio and visual means to the driver. An audio output may contain, but is not limited to, an engine noise, traffic noise, and audio instructions.

Also in accordance with the present invention a method of training of a student driver can be accomplished by using an actual vehicle while it is immobilized to allow the student driver sitting in the vehicle to use the vehicle's steering wheel to drive through the Virtual Driving Environment (VDE). Driving through the VDE, simulated by the computer and audio-visual means, provides rich simulated driving experience to the student driver. The experience can comprise encountering simulated real life-like road dangers and practicing avoidance skills. The student driver can also safely practice risk assessment skills during the driving simulation. Optional other Computer Based Training (CBT) means can be employed between the driving lessons. The CBT means can be any educational activities performed outside of a simulated driving lesson. The CBT means can include, but are not limited to, short fragments of a video presented to the student driver, followed by a commentary and a series of questions. A combination of the simulated driving activities with non-simulated CBT can be used to promote development and maintenance of the long-term driving skills. Driving through the VDE, simulated by the computer using audio and visual means capable of providing immediate feedback to the student driver, enhances the effectiveness of driver training. Training of the student driver is usually accomplished by using a curriculum comprising a series of driving lessons by repeating the above-described steps as many times as deemed desirable. A typical length of a lesson can be 10 to 15 minutes each.

Also, in accordance with the present invention a method of assessing driver's skills in the actual immobilized vehicle can be performed by using the actual vehicle, such as the driver's own vehicle, and presenting the driver with the simulated driving experience by driving through the Virtual Driving Environment (VDE). The driving simulation is accomplished by a computer and audio and visual means. While the driver drives through the VDE, measurements of the driver's performance characteristics can be taken.

The invention claimed is:

1. A portable system for simulating operation of a vehicle using an actual vehicle, the portable system comprising:
    means for relieving the friction of steered wheels of the actual vehicle with a road surface, wherein the friction is relieved sufficiently for the actual vehicle's steering to be operated using force not exceeding the force required to steer the actual vehicle in motion while the actual vehicle is immobile;

a computer for simulating a Virtual Driving Environment (VDE);

software for simulating the VDE running on the computer;

audio and visual presentation devices presenting the computer-generated VDE to a user;

non-invasive sensors reading a real-time state of a plurality of vehicle's controls configured to send data to said computer; and a motion feedback cushion providing physical body cues.

* * * * *